(12) United States Patent
Yotsuya

(10) Patent No.: US 7,144,752 B2
(45) Date of Patent: Dec. 5, 2006

(54) METHOD OF MANUFACTURING ORGANIC ELECTROLUMINESCENT DISPLAY DEVICE AND ORGANIC ELECTROLUMINESCENT DISPLAY DEVICE, AND DISPLAY DEVICE EQUIPPED WITH ORGANIC ELECTROLUMINESCENT DISPLAY DEVICE

(75) Inventor: Shinichi Yotsuya, Chino (JP)

(73) Assignee: Seiko Epson Corporation (JP)

( * ) Notice: Subject to any disclaimer, the term of this patent is extended or adjusted under 35 U.S.C. 154(b) by 105 days.

(21) Appl. No.: 10/862,189

(22) Filed: Jun. 4, 2004

(65) Prior Publication Data
US 2005/0106776 A1    May 19, 2005

(30) Foreign Application Priority Data
Jun. 6, 2003    (JP) ............... 2003-162687

(51) Int. Cl.
*H01L 51/40* (2006.01)

(52) U.S. Cl. ......... 438/99; 257/E21.007; 257/E51.005; 257/E51.022; 257/E21.026

(58) Field of Classification Search .................. 438/99; 257/E21.007, E51.005, E51.022, E51.026
See application file for complete search history.

(56) References Cited

U.S. PATENT DOCUMENTS 5,808,712 A * 9/1998 Hishida et al. ............. 349/95
6,606,135 B1 * 8/2003 Nakanishi et al. .......... 349/95
6,833,667 B1 * 12/2004 Hamano et al. ............ 313/504
6,952,311 B1 * 10/2005 Sakai .......................... 359/619
2004/0021762 A1 * 2/2004 Seki et al. ................... 347/136
2004/0211971 A1 * 10/2004 Takei et al. ................... 257/98

FOREIGN PATENT DOCUMENTS

| JP | 61153602 A | * | 7/1986 |
|---|---|---|---|
| JP | 10-172756 | | 6/1998 |
| JP | 2002-184567 | | 6/2002 |
| JP | 2003-264059 | | 9/2003 |
| JP | 2003-291404 | | 10/2003 |

OTHER PUBLICATIONS

Examination result issued in corresponding Korean application.

* cited by examiner

*Primary Examiner*—B. William Baumeister
*Assistant Examiner*—Igwe U. Anya
(74) *Attorney, Agent, or Firm*—Harness, Dickey & Pierce, P.L.C.

(57) ABSTRACT

A method of manufacturing an organic electroluminescent display device, an organic electroluminescent display device, and a display device equipped with an organic electroluminescent display device are provided that enable a microlens to be formed without affecting an organic luminescent layer during the manufacturing process and to easily manufacture an organic electroluminescent display device with increased light output efficiency. According to the method, a lens pattern corresponding to a microlens that refracts the light from an organic luminescent layer is formed by performing photolithography treatment on a first transparent resin film formed on a substrate, and the microlens is formed by performing reflow treatment on the lens pattern.

4 Claims, 10 Drawing Sheets

Photosensitive high refractive index resin 17a

METHOD OF MANUFACTURING ORGANIC ELECTROLUMINESCENT DISPLAY DEVICE AND ORGANIC ELECTROLUMINESCENT DISPLAY DEVICE, AND DISPLAY DEVICE EQUIPPED WITH ORGANIC ELECTROLUMINESCENT DISPLAY DEVICE

RELATED APPLICATIONS

This applications claims priority to Japanese Patent Application No. 2003-162687 filed Jun. 6, 2003 which is hereby expressly incorporated by reference herein in its entirety.

BACKGROUND

1. Field of the Invention

The present invention relates to a method of manufacturing an organic electroluminescent display device, an organic electroluminescent display device, and a display device equipped with an organic electroluminescent display device, the organic electroluminescent display device making a display through the light-emitting state of a plurality of organic luminescent layers.

2. Description of the Related Art

Current display devices can be classified into CRTs (Cathode Ray Tubes) and flat display panels composed of various types of elements. Flat display panels are light-weight and have a better luminous efficiency than CRTs, and have been developed over the years for use as monitor screens for computers, televisions and the like. Recently, research is focusing on active matrix driven organic EL (Electroluminescence) displays.

The organic EL display is of a configuration that sandwiches a thin film including a fluorescent inorganic and organic compound between a cathode and an anode, and the configuration has an array of elements that are induced to emit light using the radiation of light (fluorescence, phosphorescence) produced when excitons decay that have been generated by recombination of electrons and holes injected in the thin film. Such active matrix driven organic EL displays are getting a lot of attention as they feature a thin structure and high resolution.

FIG. 10 is a sectional view showing an example of a configuration of an organic EL panel 101a included in a conventional organic EL display.

The organic EL panel 101a has a configuration wherein a light-emitting element 114 and a desiccant 109 are sealed through a transparent glass 111 and a sealing glass 111a. In this organic EL panel 101a, the space sealed by the glass 111 and the sealing glass 111a is desiccated by the desiccant 109, and light Lp emitted by a light-emitting element 114 crosses the glass 111 and is emitted to the outside.

With surface emitting elements such as the organic panel 101a, a problem is encountered in that light is lost and thus the light output efficiency is poor, as the light Lp from the pixel including the light-emitting element 114 is diffused in all directions and light Lu, having an angle exceeding the critical angle with regard to the surface of the glass 111, cannot be emitted to the outside of the glass 111 due to a total reflection phenomenon.

Conventionally, to solve such problems, organic EL light-emitting devices of a configuration such as the one shown in Japanese unexamined patent application publication 10-172756 have been known.

Such a conventional organic EL light-emitting device uses a configuration, wherein a microlens 2 is located inside a light transmissive base board 1 as shown in FIG. 1 appended to the patent application publication, a microlens 22 is located inside a light transmissive base board 21 as shown in FIG. 2, microlenses 32 and 33 are located inside a light transmissive base board 31 as shown in FIG. 3. However, with such a conventional configuration, it is difficult and thus costly to place the microlens 2 inside the light transmissive base board 1.

Further, in FIG. 4 of unexamined patent application publication H10-172756, a configuration is used wherein a microlens 42 is provided inside a backing layer 43 that is formed on a light transmissive base board 41.

An organic EL light-emitting device 40 has a configuration wherein the microlens inside the backing layer 43 has a convex curved surface formed on the side of the light transmissive base board 41 rather than on the side of the lower electrode 44a.

In the organic EL light-emitting device 40 of such a configuration, when comparing it to an organic EL light-emitting device 10 shown in FIG. 1 and others, the difficulty with manufacturing is seemingly resolved because the microlens 42 is not formed inside the light transmissive base board 41 anymore.

However, in such an organic EL light-emitting device 40, as the microlens 42 inside the backing layer 43 has a convex curved surface formed on the side of the translucent substrate 41, a problem exists in that, when the light from a light-emitting layer 44b that is provided between an opposed electrode 44c and the lower electrode 44a is refracted, the margin of the critical angle is small, at which the light ends up being reflected inside the microlens 42 instead of being transmitted through the light transmissive base board 41.

Further, in unexamined patent application publication H10-172756, no concrete manufacturing procedure is disclosed regarding the organic EL light-emitting device 40 shown in FIG. 4. Further, for the active matrix driven organic EL light-emitting device 40, the manufacturing seems problematical, as the substrate process becomes a high temperature process of about 500 degrees that requires the microlens 42 itself to be able to withstand such high temperatures.

Here, the present invention is intended to solve the above-mentioned issue by providing a method of manufacturing an organic electroluminescent display device, an organic electroluminescent display device, and a display device equipped with an organic electroluminescent display device that enable a microlens to be formed without affecting an organic luminescent layer during the manufacturing process, and to easily manufacture an organic electroluminescent display device with increased light output efficiency.

SUMMARY

A first aspect of the present invention solves the above issue by providing a method of manufacturing an organic electroluminescent display device having a surface emitting element that includes:

forming a switching element for controlling the light-emitting state of an organic luminescent layer on a transparent substrate, forming a lens pattern corresponding to a microlens that refracts the light from the organic luminescent layer by performing photolithography treatment on a first transparent resin film that has been formed on the substrate, followed by performing reflow treatment on the lens pattern so as to form the microlens, accumulating a second transparent resin having a lower refractive index than the first transparent resin so as to cover the microlens and then hardening the second transparent resin, forming a second electrode on the second transparent resin, forming the organic luminescent layer on the second electrode, and forming a first electrode on the organic luminescent layer.

Thus an organic electroluminescent display device having a surface emitting element in which the light-emitting state of the organic luminescent layer, provided between the first electrode and the second electrode that is transparent intersecting in matrix form, is controlled by a switching element controlled by the first and second electrodes is manufactured.

With the above configuration, the microlens can be easily formed by performing photolithography and reflow treatment on the first transparent resin formed on the substrate by film forming before the organic luminescent layer is formed. Therefore, adversely affecting the heat-sensitive organic luminescent layer can be avoided when forming the microlens.

According to a second aspect of the invention in addition to the configuration of the first aspect, when accumulating and hardening, the hardening is carried out while pressing a flat substrate against the second transparent resin which has been accumulated.

In this configuration, the flatness of the surface of the accumulated second transparent resin is increased by pressing a flat substrate against it. Thus, the light output efficiency can be increased by avoiding a situation wherein the light emitted from the organic luminescent layer is affected by the interface between the second transparent resin and the second electrode that is also transparent.

According to a third aspect of the invention in addition to the configuration of either one of the first or second aspects, when forming the microlens, a film is formed of the second transparent resin on the substrate by spin coating.

This configuration enables easy film formation of the second transparent resin on the substrate.

According to a fourth aspect of the invention in addition to the configuration of any one of the first through third aspects, when forming the microlens, the first transparent resin is formed so as to have a convex curved surface on the side of (i.e., facing) the second electrode.

With such a configuration, it becomes less likely for the light generated from the organic luminescent layer to exceed the critical angle at which the light will be reflected without crossing the microlens in the case of crossing the convex curved surface form microlens on the side of the second transparent resin as compared to the case of crossing the convex curved surface form microlens on the side of the substrate. Therefore, forming the convex curved surface form microlens on the side of the second transparent resin leads to an increased output efficiency of light generated by the organic luminescent layer, thus enabling the manufacture of an organic electroluminescent display device with reduced electrical power consumption.

A fifth aspect of the invention is achieved by an organic electroluminescent display device that includes:

a transparent substrate, a switching element controlled by a first electrode and a second electrode that is transparent intersecting in matrix form, a surface emitting element wherein an organic luminescent layer is provided between the first electrode and the second electrode, and the light-emitting state of the organic luminescent layer is controlled by the switching element, and a microlens provided between the substrate and the second electrode, having a convex curved surface form on the side of the second substrate.

With such a configuration, it becomes less likely for the light generated from the organic luminescent layer to exceed the critical angle at which the light will be reflected without crossing the microlens in the case of crossing the convex curved surface form microlens on the side of the second substrate as compared to the case of crossing the convex curved surface form microlens on the side of the substrate. Therefore, forming the convex curved surface form microlens on the side of the second substrate will lead to an increased output efficiency of light generated by the organic luminescent layer and the electrical power consumption of the organic electroluminescent display device can be decreased.

According to a sixth aspect of the invention in addition to the configuration of the fifth aspect, the diameter of the microlens is from 1 μm to 50 μm.

With this configuration, the height of the completed microlens can be reduced, and the distance between each center of curvature of the lens and the light-emitting part can be made to approach each other, and the efficiency thus increases considerably. A diameter of the microlens of 1 μm to 50 μm is preferred. If the diameter of the microlens is less than 1 μm, the optical focal power decreases due to a diffraction phenomenon, and if the diameter of the microlens is more than 50 μm, the distance between the microlens and the light-emitting part is too close compared to the focal distance, and thus a problem arises in that the loss of light increases as not all of the light scattered in all directions can be refracted above the critical angle. Further, when therefore forming the light-emitting part in a spaced apart position, close to the focal distance, not all of the light scattered in all directions can be made to enter the microlens that is directly below the light-emitting part, and some will enter the microlens of a different light-emitting part, thereby creating the risk of inducing a crosstalk phenomenon. Therefore, by choosing an optimal microlens diameter of 1 μm to 50 μm, an organic electroluminescent display device can be achieved with a minimum loss of light.

According to a seventh aspect of the invention in addition to the configuration of either one of the fifth or sixth aspects, a plurality of microlenses is provided corresponding to each organic luminescent layer.

Due to the existence of a plurality of microlenses with this configuration, the light output efficiency of the light from each organic luminescent layer increases, and thus the luminance increases.

According to an eighth aspect of the invention in addition to the configuration of any one of the fifth to seventh aspects, the refractive index of the microlens is from 1.5 to 1.8, and the refractive index of the second transparent resin is from 1.2 to less than 1.5.

With such a configuration, the power of the microlens can be enforced by choosing a large difference in refractive index, and all of the light scattered in all directions can be refracted above the critical angle, and thus an organic electroluminescent display device can be achieved with a minimum loss of light.

A ninth aspect of the invention is achieved through a display device equipped with an organic electroluminescent display device that makes a display through the light-emitting state of a plurality of organic luminescent layers, the organic electroluminescent display device including:

a transparent substrate, a switching element controlled by a first electrode and a second electrode that is transparent intersecting in matrix form, a surface emitting element wherein the state of the organic luminescent layers is controlled by the switching element, the organic luminescent layers being provided between the first electrode and the second electrode, and a microlens having a convex curved surface form on the side of the second electrode, the microlens being provided between the substrate and the second electrode.

With this configuration, it becomes less likely for the light generated from the organic luminescent layers to exceed the critical angle at which the light will be reflected without crossing the microlens in the case of crossing the convex curved surface form microlens on the side of a second transparent resin as compared to the case of crossing the convex curved surface form microlens on the side of the substrate. Therefore, forming the convex curved surface form microlens on the side of the second transparent resin leads to an increased output efficiency of light generated by the organic luminescent layers, and thus the electrical power consumption of the display device equipped with the organic electroluminescent display can be decreased.

DETAILED DESCRIPTION

Following is an explanation of a preferred embodiment with reference to the drawings.

Figure 1:
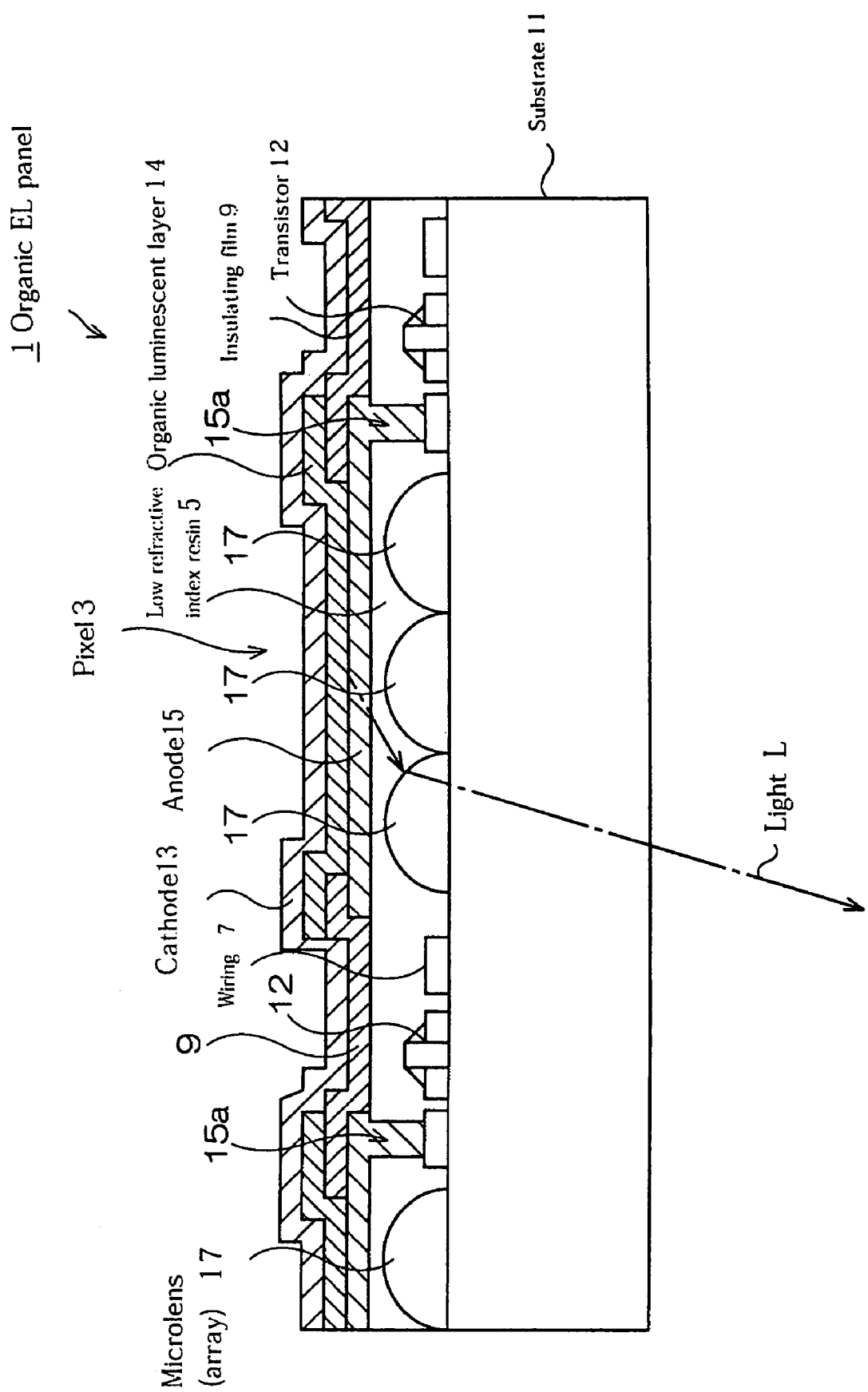
FIG. 1 is a sectional view showing an example of a configuration of an organic electroluminescent (EL) panel in accordance with an embodiment of the invention.

FIG. 1 is a sectional view showing an example of a configuration of an organic electroluminescent (EL) panel 1 to which an organic electroluminescent display device as a preferred embodiment of the present invention is applied.

The organic EL panel 1 is to be mounted to a display device, and includes a substrate 11, a microlens 17, a low refractive index resin 5, a transistor 12, a wiring 7, an insulating layer 9, an anode 15, an organic luminescent layer 14, and a cathode 13. This organic EL panel 1 is a sealant substrate light-emitting organic EL panel that emits light from the surface of the substrate 11 towards the outside (lower part of the drawing).

The substrate 11 is a transparent substrate like a glass plate. On this substrate, the low refractive index resin 5 is provided. In the inner part of this low refractive index resin 5, a microlens array composed of an array of more than one microlens 17 is formed. Further, in the inner part of this low refractive index resin 5, the transistor 12, the wiring 7 and an opening part 15a that extends from the anode 15 are provided.

The microlens 17 is composed of a transparent resin with a high refractive index, for example the refractive index (nD) being from 1.5 to 1.8. On the other side, the low refractive index resin 5 consists of a resin with a low refractive index, for example this refractive index (nD) being from 1.2 to less than 1.5. It is preferable for the refractive index (nD) of the microlens 17 to be 1.5 or more, because the larger the difference between the refractive index of the low refractive index resin 5 and the microlens 17, the stronger the power of the microlens, and thereby refracting all of the light scattered in all directions above the critical angle, an organic EL panel 1 can be achieved with a minimum loss of light. If it is less than 1.5, there is a risk of a total reflection phenomenon occurring at the interface with the refractive index (nD) of the substrate 11 being for example 1.5.

Further, it is preferable for the refractive index of the microlens 17 to be 1.8 or less, because the refractive index of the microlens 17 exceeding 1.8 leads to a combination where the difference in refractive index exceeds 0.6 to the one of the low refractive index resin 5. In that combination there is a risk that the reflection at the interface gets too large and the light output efficiency thus decreases.

On the other hand, it is preferable for the refractive index of the low refractive index resin 5 to be 1.2 or more, as it otherwise leads to a combination where the difference in refractive index exceeds 0.6 to the one of the microlens 17. In that combination there is a risk that the reflection at the interface gets too large and the light output efficiency thus decreases. Further, it is preferable for the refractive index of the low refractive index resin 5 to be less than 1.5, as it otherwise leads to a combination where the difference in refractive index falls below 0.1 to the one of the microlens 17. In that combination the power of the microlens weakens, and not all of the light scattered in all directions can be refracted above the critical angle, leading to an organic EL panel 1 with a large loss of light.

With such a configuration, all of the light scattered in all directions can be refracted above the critical angle, and the organic EL panel 1 can be achieved with a minimum loss of light.

Further, the diameter of the microlens 17 is preferably from 1 μm to 50 μm. It is preferable for the diameter of the microlens 17 to be 1 μm or more, as otherwise due to a diffraction phenomenon of the light the optical focal power decreases and the focal power becomes small.

Further, it is preferable for the diameter of the microlens 17 to be 50 μm or less, because when the diameter of the microlens exceeds 50 μm, the distance between the light-emitting part and the microlens 17 is too close compared with the focal distance, and therefore not all of the light scattered in all directions can be refracted above the critical angle, leading to an increase in negative influences such as an increased loss of light. Further, when therefore forming the light-emitting part in a position apart, close to the focal distance, not all of the light scattered in all directions can be made to enter the microlens that is directly below the light-emitting part, and some will enter the microlens 17 of a different light-emitting part, thereby creating the risk of inducing a crosstalk phenomenon.

With such a configuration, the organic EL panel 1 can be achieved with a minimum loss of light by choosing the optimum diameter of the microlens 17 to be 1 μm to 50 μm.

On this low refractive index resin 5, the cathode 13, the organic luminescent layer 14 and the anode 15 are provided. The cathode 13, the organic luminescent layer 14 and the anode 15 compose an organic EL element. The cathode 13, the organic luminescent layer 14 and the anode 15 are provided on the low refractive index resin 5 in a plurality, each set composing a pixel 3. Further, on the substrate 11 the transistor 12 is provided as a switching element that is controlled by the cathode 13 and the anode 15 intersecting in the form of a matrix.

This transistor 12 has the function to control the light-emitting state of the organic luminescent layer 14 that is provided between the cathode 13 and the anode 15. That is to say, this transistor 12 has the function to actively drive the organic EL element that includes the organic luminescent layer 14 and the like. Further, to insulate the organic luminescent layer 14 from another organic luminescent layer 14 on the low refractive index resin 5 the insulating layer 9 is provided.

To each organic luminescent layer 14 at least one associated microlens 17 is provided. In the present embodiment, more than one microlens 17 is provided to each organic luminescent layer 14. With such a configuration, due to the existence of more than one microlens 17, the efficiency of the light output and the luminance of the light from each organic luminescent layer 14 improves.

The pitch of this microlens array 17 is preferably within a range of for example 1 to 100 μm. With such a configuration, each pixel 3 can be covered with a microlens array (MLA) composed of more than one microlens 17, and thus the height of the microlens 17 can be kept low. Further, as the gap between the organic luminescent layer 14 and the microlens array can be filled in the organic EL panel 1, a high contrast picture can be achieved with no crosstalk between more than one pixel 3 that can be caused when the light emitted from each pixel 3 is mixed and then condensed by the microlens 17.

Characteristic in the present embodiment is that the microlens 17 is for example provided between the anode 15 and the substrate 11. Furthermore a characteristic in the present embodiment is that as mentioned above, the microlens 17 has for example on the side of the anode 15 a convex curved surface form. With such a configuration, it becomes less likely for the light generated from the organic luminescent layer 14 to exceed the critical angle at which the light will be reflected without crossing the microlens 17 in the case of crossing the convex curved surface form microlens 17 on the side of the anode 15 as compared to the case of crossing the convex curved surface form microlens 17 on the side of the substrate 11. Therefore, forming the convex curved surface form microlens 17 on the side of the anode 15 will lead to an increased output efficiency of light generated by the organic luminescent layer 14 and the organic EL panel 1 with reduced electrical power consumption can be composed.

The organic EL panel 1 being of the above configuration, an explanation follows of an example of the behavior of the organic EL panel 1.

In this organic EL panel 1, each organic EL element is driven by the active matrix drive. Concretely, in each organic EL element, the cathode 13 and the anode 15 compose a matrix structure, and by applying a voltage between the cathode 13 and the anode 15 corresponding to the pixel 3 that is selected, the transistor 12 is controlled, and due to the operation of the transistor 12, a current will flow in the organic luminescent layer 14 that is provided between the cathode 13 and the anode 15, thus inducing the organic luminescent layer 14 to emit light.

The light generated by the organic luminescent layer 14 crosses the anode 15 that is transparent and the low refractive index resin 5 that has a low refractive index, and enters the microlens 17. As the microlens 17 has a higher refractive index than the low refractive index resin 5, the light generated by the organic luminescent layer 14 is refracted, crosses the substrate 11 and is emitted to the outside part of the organic EL panel 1. At this instant, as the microlens 17 is of a convex curved surface form on the side of the anode 15, the light from the organic luminescent layer 14 can cross the substrate 11 efficiently without being affected by the critical angle of the microlens 17.

Therefore, not only can the efficiency of the light output and the luminance of the light from the organic luminescent layer 14 be increased for the organic EL panel 1, the power consumption can be decreased at a luminance that is the same as conventional luminance.

This concludes the above example of the behavior of the organic EL panel 1. An explanation now follows of an example of the steps of the procedure of the manufacturing method of the organic EL panel 1.

FIGS. 2 to 7 are sectional views showing an example of a process of the manufacturing method of the organic EL panel 1 shown in FIG. 1.

Forming the Switching Element etc.

Figure 2A:
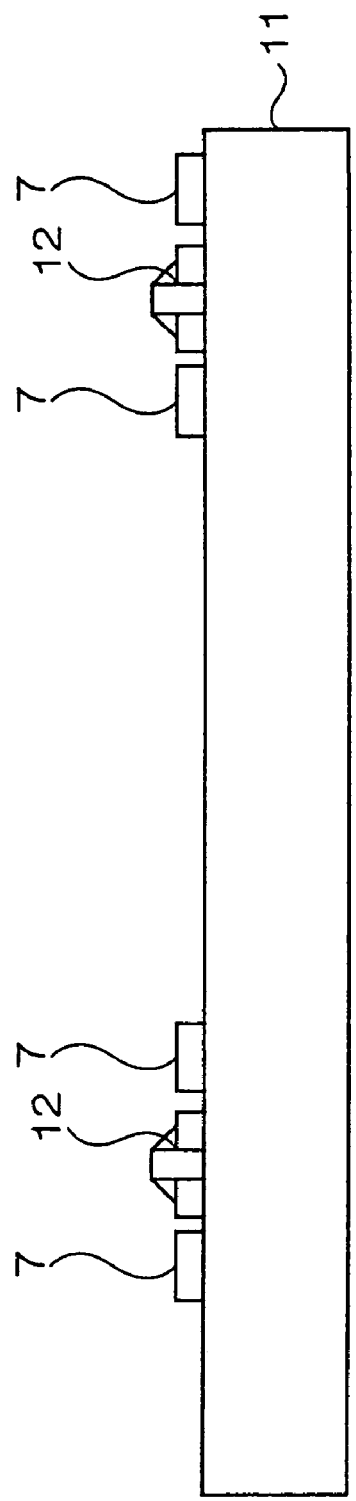
FIGS. 2a and b are sectional views showing an example of a sequence of the manufacturing method of the organic EL panel.

First, as shown in FIG. 2(a), the transparent substrate 11 of a non-alkali glass material for example is prepared. On this substrate 11, the wiring 7 constituting the circuit, the transistor 12 being for example a polycrystalline silicon thin film transistor, a condenser and the like are formed.

Forming the Microlens

Figure 2B:
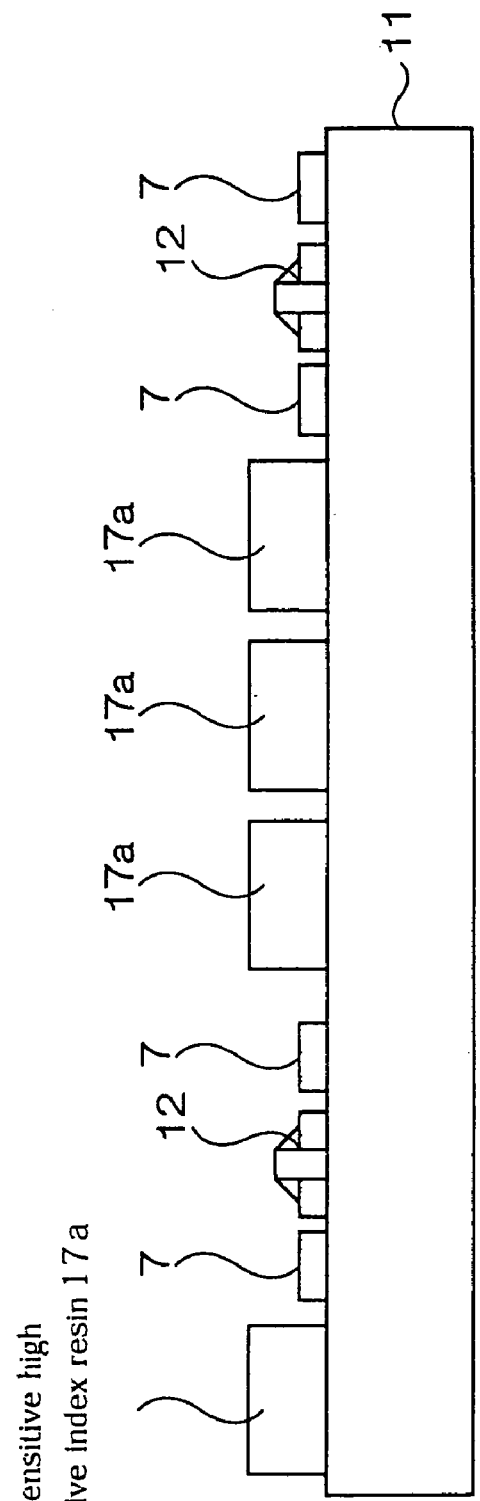

As shown in FIG. 2(b), on the substrate 11 onto which the transistor 12 and the like have been formed, a film is formed of a resin (photosensitive high refractive index resin 17a) as a base material for forming the microlens 17. As this photosensitive high refractive index resin 17a, for example MFR-344H made by JRS with a refractive index (nD) of 1.62 is used. Further, as a method of forming the film of the photosensitive high refractive index resin 17a, for example spin coating is used. The film of the photosensitive high refractive index resin 17a that is formed by spin coating is coated with a film thickness of 3.0 μm for example. And, a lens pattern smaller than the pixel 3 is formed of about 33 μm square by applying photolithography technology against the photosensitive high refractive index resin 17a formed on the substrate 11 in such a way.

Figure 3A:
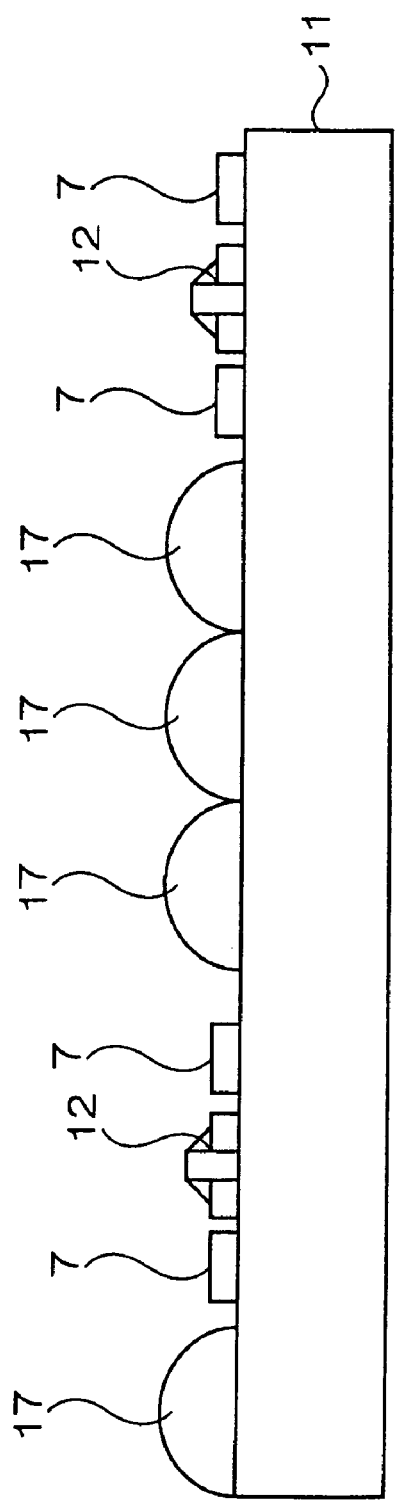
FIGS. 3a and b are sectional views showing an example of a sequence of the manufacturing method of the organic EL panel.

The substrate 11 onto which a lens pattern as shown in FIG. 2(b) has been formed is then processed by reflow treatment by putting it into a clean oven at 180 degrees for 30 minutes for example, and a lens form as shown in FIG. 3(a) is formed corresponding to the form of the microlens 17 that refracts the light from the organic luminescent layer 14.

Resin Accumulating and Hardening

Figure 3B:
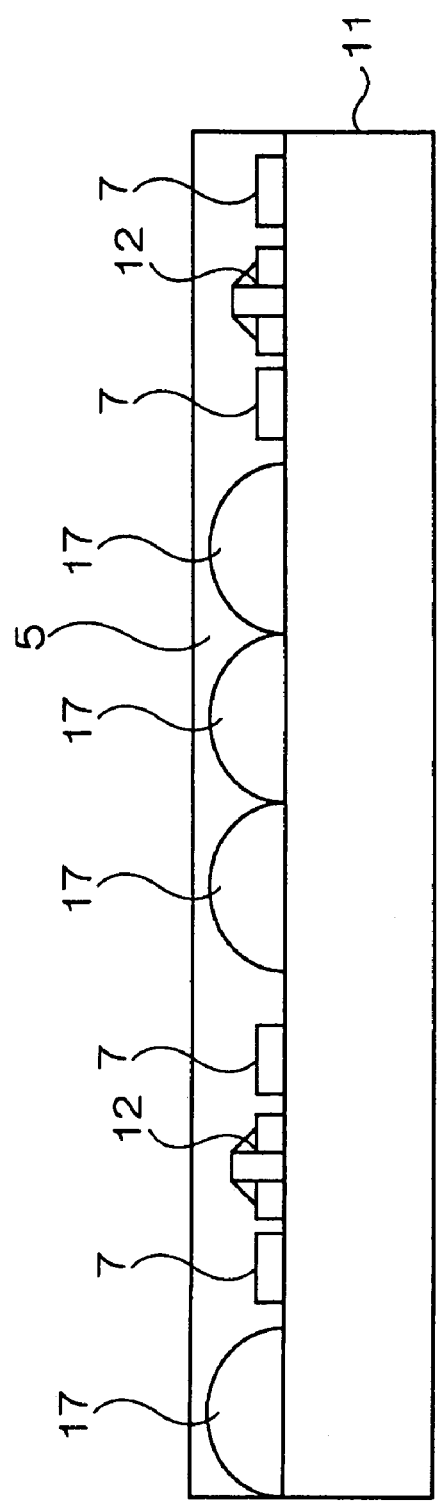

Next, an acrylic resin with a refractive index of about 1.38 is applied by spin coating and the like onto the surface of the substrate 11 on which among others the microlens 17 are formed, and by putting it into a clean oven with an atmosphere of about 180 degrees for about 30 minutes the surface of this acrylic resin is caused to reflow, and planarization is carried out as in the low reflective index resin 5 shown in FIG. 3(b). The planarized low refractive index resin 5 is composed so as to cover the microlens 17 and the like formed on the substrate 11.

Forming the Second Electrode

Figure 4A:
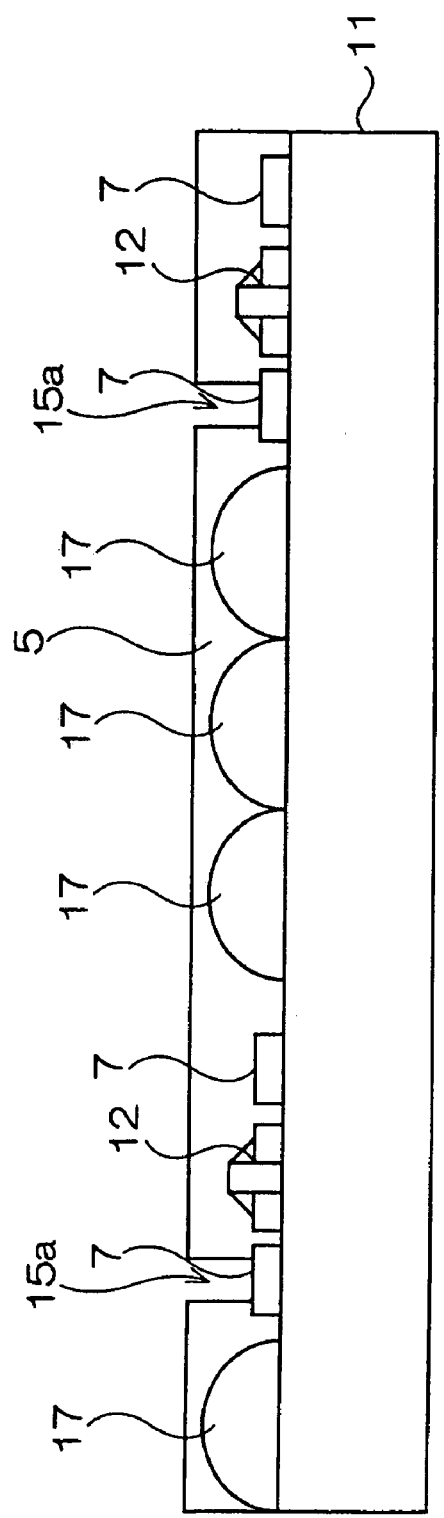
FIGS. 4a and b are sectional views showing an example of a sequence of the manufacturing method of the organic EL panel.

On this surface of the low refractive index resin 5 composed in such a way, a resist (not shown) is coated, and by dry etching using oxygen for example, the opening part 15a is formed in a desired part as shown in FIG. 4(a).

Figure 4B:
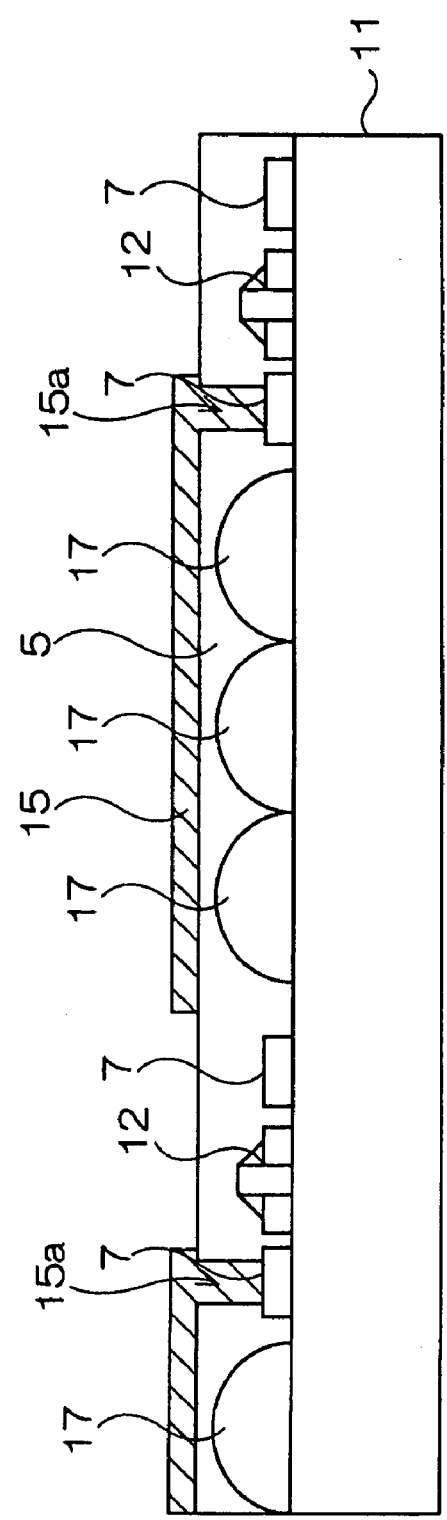

In part of the surface of the low refractive index resin 5 including this opening part 15a, a film of about 100 nm including for example mainly indium tin oxide (ITO) is formed by sputtering as shown in FIG. 4(b), and, patterning of the anode 15 corresponding to the anode 15 of the pixel 3 is carried out by photolithography technology.

Figure 5A:
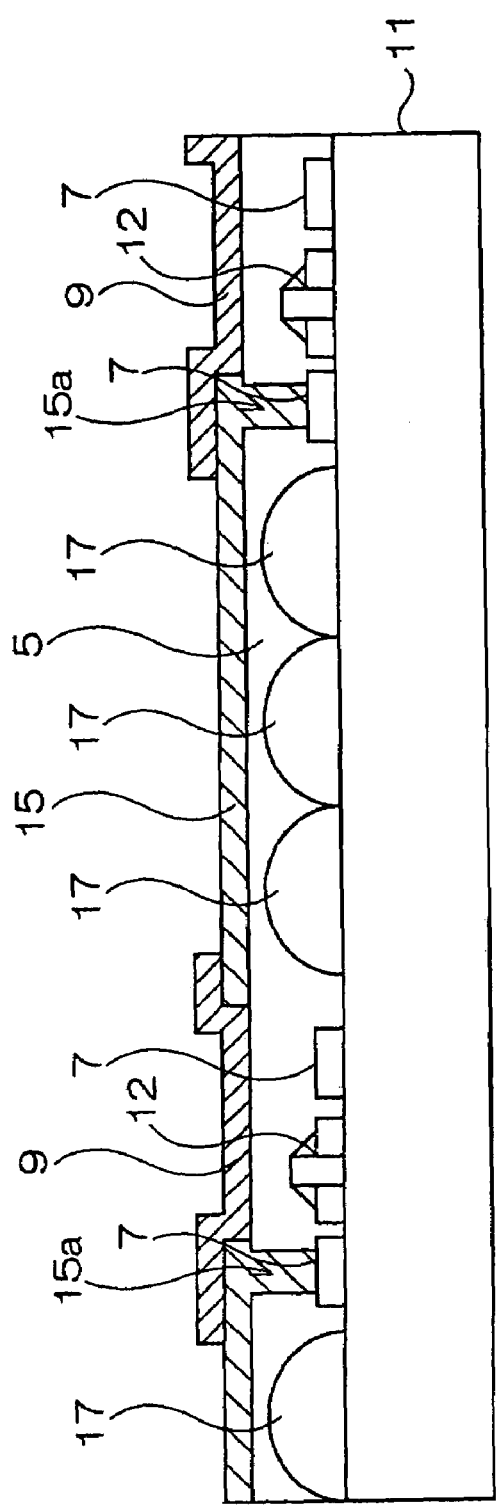
FIGS. 5a and b are sectional views showing an example of a sequence of the manufacturing method of the organic EL panel.

Furthermore, by forming a film of silicon oxide and the like at the connection of each anode 15 to the others, as shown in FIG. 5(a), the insulating layer 9 is formed. By forming the insulating layer 9, the division of the pixel 3 becomes definite.

Forming the Luminescent Layer

Figure 5B:
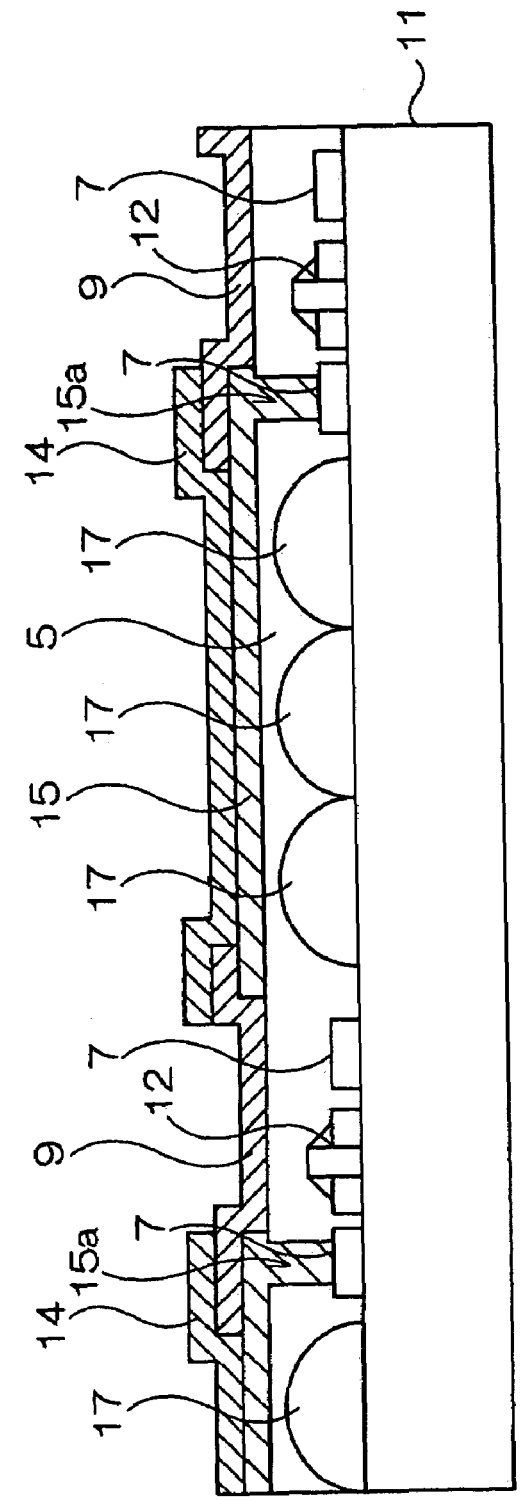

Next, as shown in FIG. 5(b), the organic luminescent layer 14 is formed on the anode 15 by evaporation for example.

Forming the First Electrode

Figure 6:
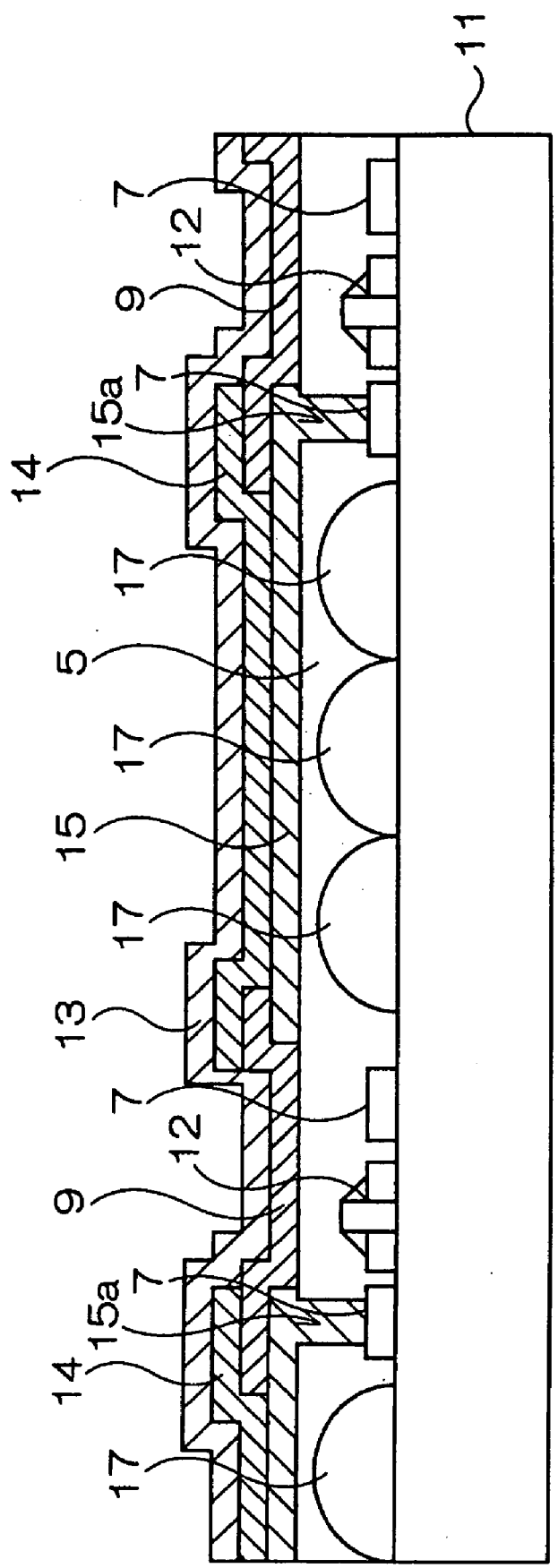
FIG. 6 is a sectional view showing an example of a sequence of the manufacturing method of the organic EL panel.

Next, as shown in FIG. 6, the cathode 13 is formed on the organic luminescent layer 14 and the insulating layer 9. Next, though not shown, defined sealing is carried out, and as shown in FIG. 1, the active matrix driven organic EL panel 1 having the microlens 17 is completed.

According to a preferred embodiment of the present invention, with the organic EL panel 1 having a microlens array completed in this way, compared with organic EL panels without a microlens array, about twice the luminance can be achieved by applying an identical driving voltage, and also the luminance efficiency is about double. Further, with such a manufacturing method of the organic EL panel 1, the microlens 17 can be easily formed by performing photolithography treatment and reflow treatment on the photosensitive high refractive index resin 17a, as shown in FIG. 2(b), before forming the organic luminescent layer 14.

Therefore, the possibility that the organic luminescent layer 14 (which is sensitive to heat) is negatively affected when forming the microlens 17 of FIG. 1 can be avoided. Further, not only can the luminance efficiency be increased for the organic EL panel 1 having a microlens array including the microlens 17, but having a microlens 17 having a convex curved surface form on the side of the anode 15 results in an increase of the margin of the critical angle at which the light from the organic luminescent layer 14 is reflected by the microlens 17, and thus, the output efficiency of light can be further improved. Therefore, at a luminance that is the same as that of conventional organic EL panels, with lower power consumption than conventionally, the luminous lifetime can be lengthened. Consequently, an advantage such as the above-mentioned can be also obtained for a display device equipped with the organic EL panel 1.

Further, in the above embodiment, as shown in FIG. 3(a), when forming the low refractive index resin 5 on the substrate 11 onto which the microlens 17 and the like are formed, the planarization is carried out by causing reflow at a set temperature, after applying an acrylic resin by spin coating as a base material to the low refractive index resin 5 composing the same. Planarization, though, may also be carried out by a method such as the one described in the following.

Figure 7:
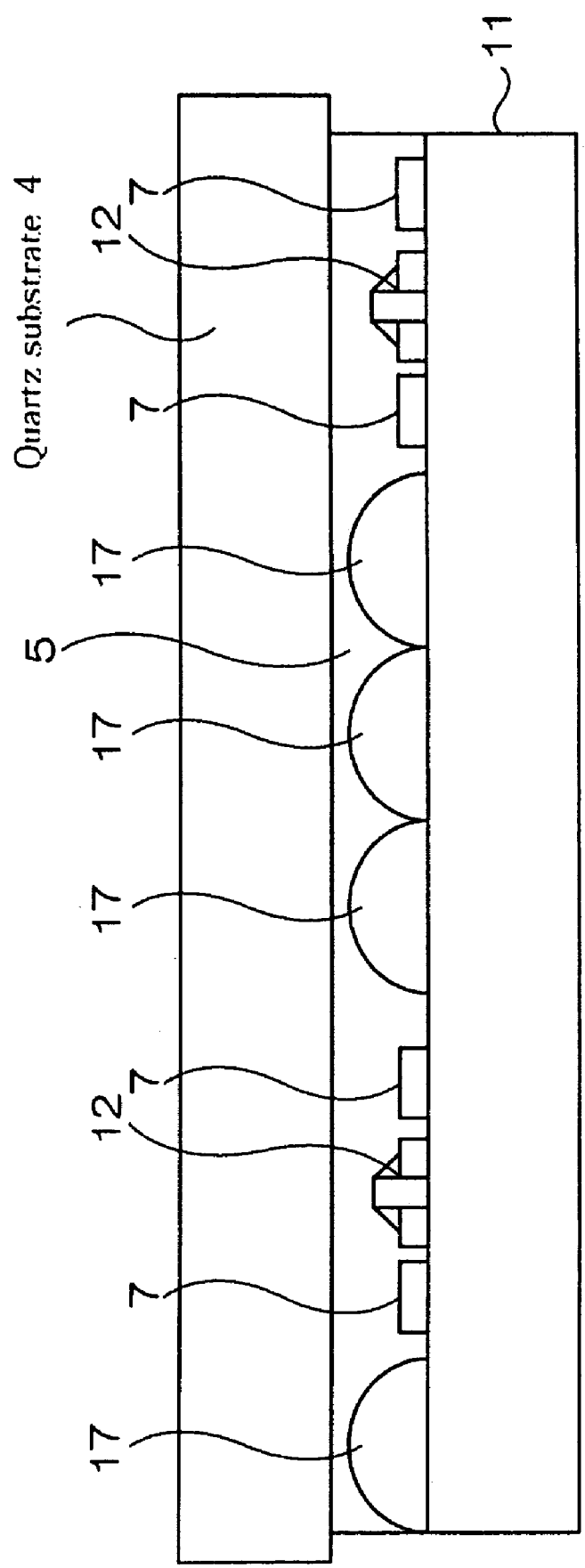
FIG. 7 is a sectional view showing an example of a sequence of the manufacturing method of the organic EL panel.

Concretely, as shown in FIG. 7, on the substrate 11 onto which the microlens 17 and the like are formed, an acrylic resin with a refractive index of 1.38 for example is applied as the low refractive index resin 5. As such an acrylic resin, World Rock No. 7702 produced by Kyoritsu Chemical can be used for example. The acrylic resin applied onto the substrate 11, as shown in FIG. 7, then undergoes an adhesion and hardening process to hold a quartz substrate (glass substrate) 4 of a thickness of for example 3 mm.

It is then preferable to perform a water repellency treatment on the surface of the quartz substrate 4. As a method for performing such a water repellency treatment on the surface of the quartz substrate 4, a silane coupling agent and the like such as HMDS (hexamethyldisilazane) is adequate. Alternatively, plasma deposition by CF gas can be given as an example.

Next, the quartz substrate 4 is exfoliated, and as shown in FIG. 3(b), the surface of the low refractive index resin 5 undergoes planarization. As the quartz substrate 4 undergoes water repellency treatment, the adhesion force of the low refractive index resin 5 of being originally adhesive for example is reduced almost to zero, and the quartz substrate 4 can be exfoliated easily. Taking over the smooth surface form of the quartz substrate 4, the surface of the low refractive index resin 5 from which the quartz substrate 4 has been exfoliated can be made to be smooth. Into the low refractive index resin 5 that has undergone such smoothing, the opening part 15a is formed in a designated location as shown in FIG. 4(a).

The present invention is not limited by the above-mentioned embodiment, and various modifications can be made within the scope of the Claims. For example, in each of the above configurations of the embodiment, parts can be omitted and arbitrarily combined to differ from the above. Further, in the above embodiment, a silicon oxide film of for example 60 nm may be inserted between the low refractive index resin 5 and the anode 15. With such a configuration, the adhesion can be improved between the low refractive index resin 5 and the anode 15.

Figure 8:
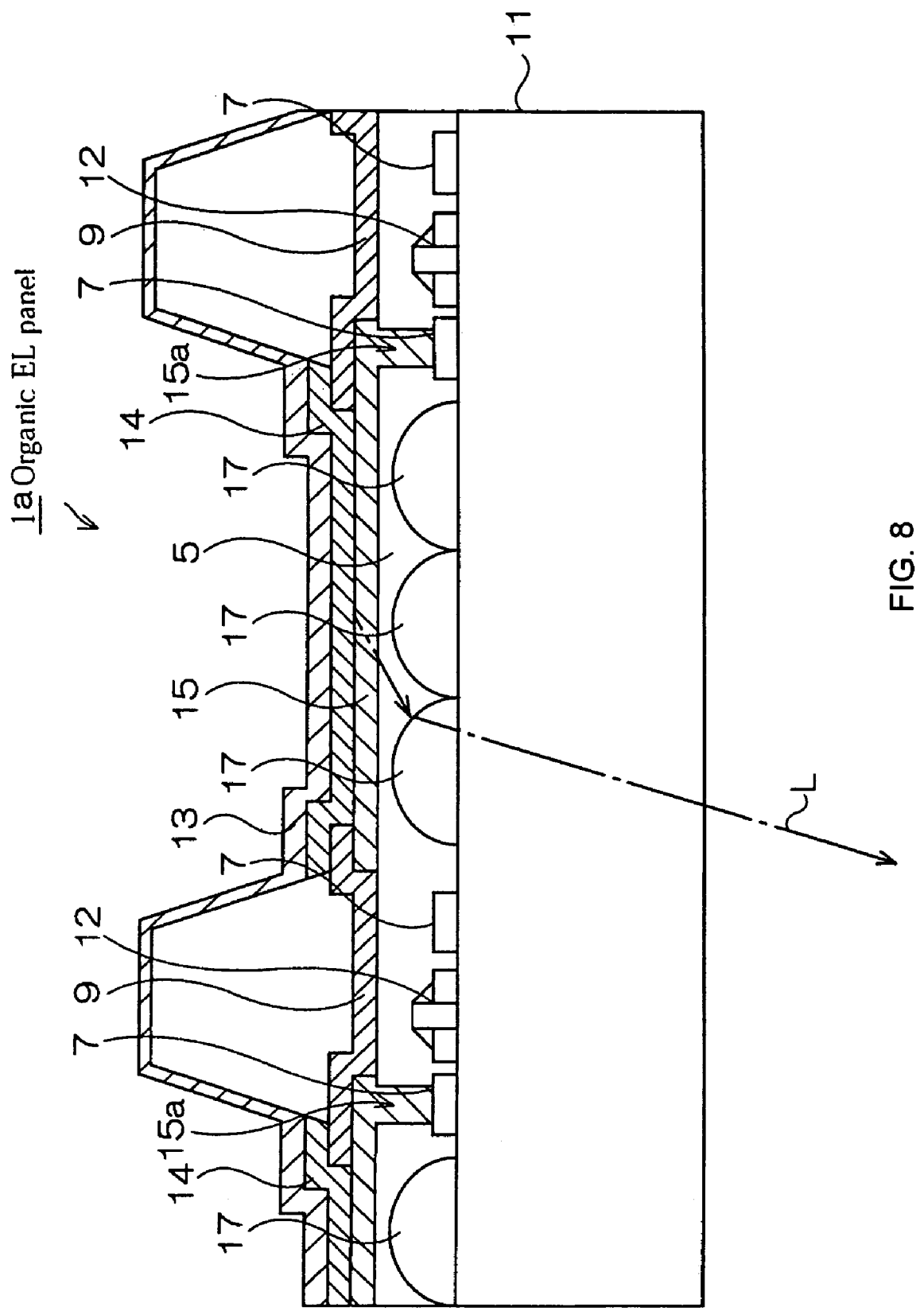
FIG. 8 is a sectional view showing an example of an application of the organic EL panel in accordance with the present embodiment.

Further, in the above embodiment, the organic EL panel 1 is explained as using a low-molecular organic EL element for example, but, as shown in FIG. 8, a high-molecular organic EL element can also be used to obtain the same effect. For example, when manufacturing a full color panel, the high-molecular organic EL material can be selectively applied as a liquid by using an inkjet process. Therefore, if a wall called a bank is formed on the panel between pixels to separate each pixel from the others, so that the liquid does not flow to the other pixels, a panel can be manufactured just as the low-molecular organic EL.

Figure 9:
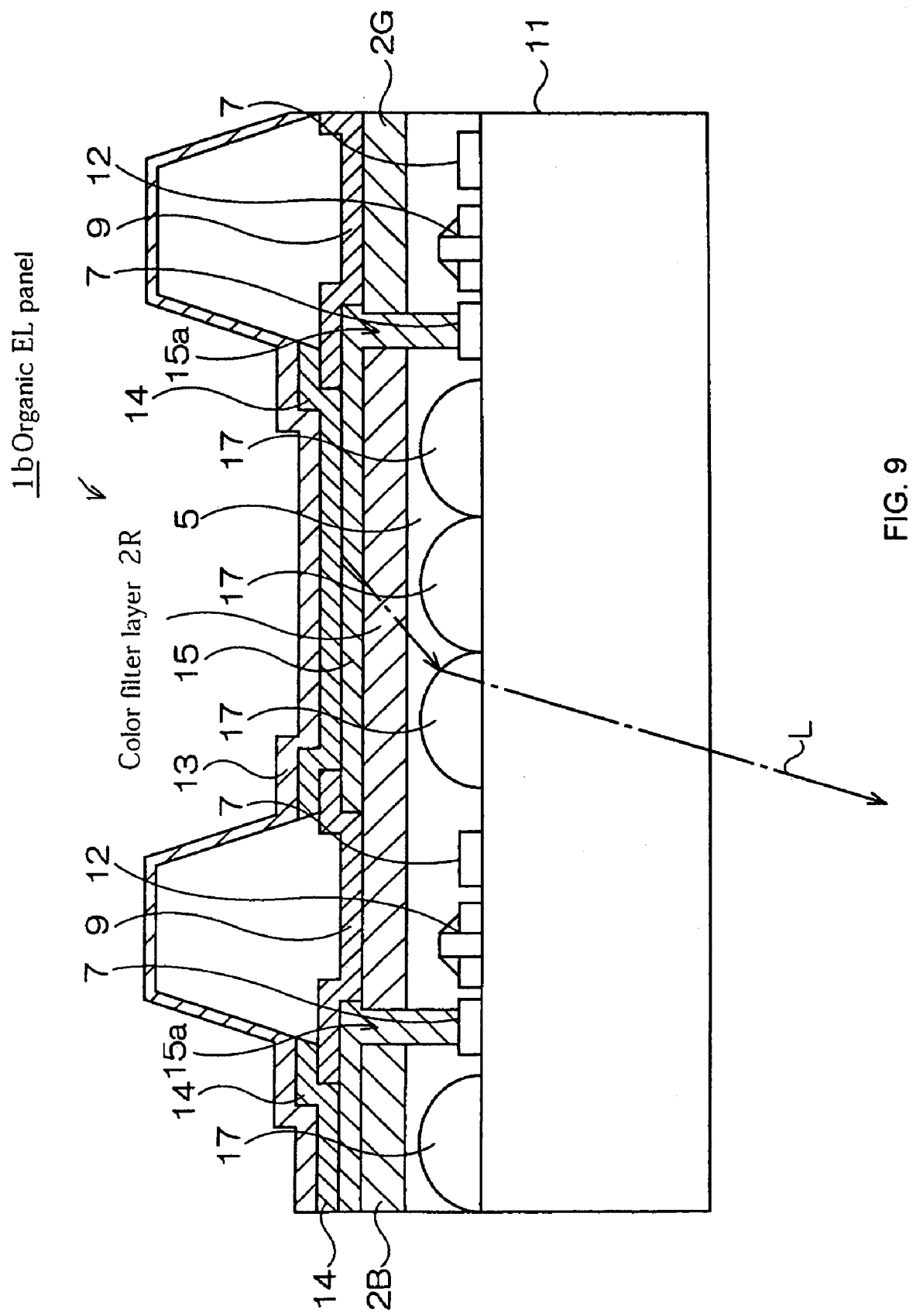
FIG. 9 is a sectional view showing an example of an application of the organic EL panel in accordance with the present embodiment.
Figure 10:
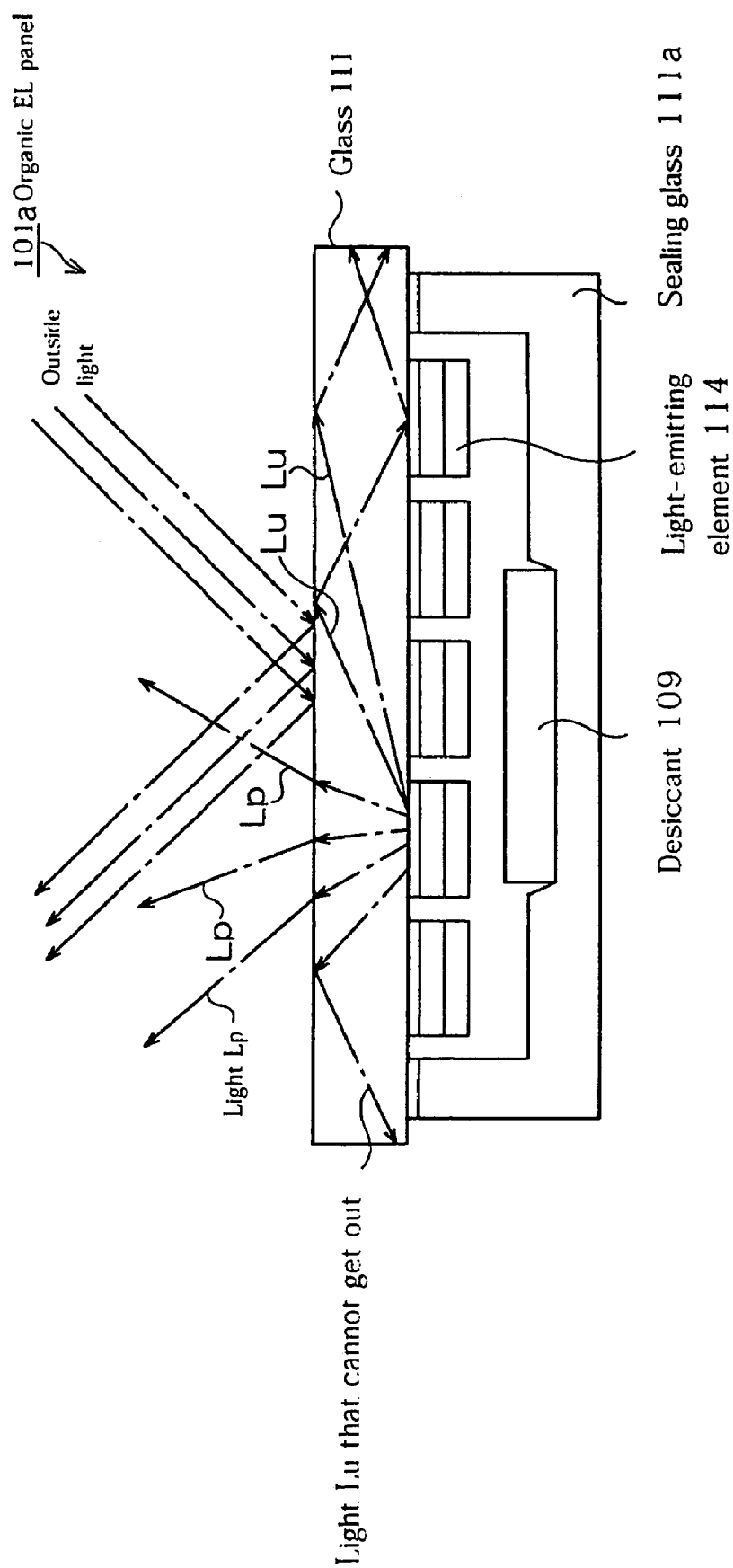
FIG. 10 is a sectional view showing an example of a conventional configuration of an organic EL panel.

Further, the above embodiment is not limited to a configuration of an organic EL panel 1a as shown in FIG. 8, but can also be applied to an effective organic EL panel 1b shown in FIG. 9.

This organic EL panel 1b uses practically the same processes as the above-mentioned processes, and in addition to the configuration of the organic EL panel 1a shown in FIG. 8, color filter layers 2B, 2R, 2G are formed by color filter resist between the low refractive index resin 5 and the anode 15. With such a configuration, a full color display device can be achieved that uses an organic EL panel emitting white light.

What is claimed is:

1. A method of manufacturing an organic electroluminescent display device having a surface emitting element, comprising:

forming a switching element for controlling the light-emitting state of an organic luminescent layer on a transparent substrate;

forming a lens pattern corresponding to a a microlens that refracts light from the organic luminescent layer by performing photolithography treatment on a first transparent resin which has been formed on the substrate, followed by performing reflow treatment on the lens pattern so as to form the microlens;

accumulating a second transparent resin having a lower refractive index than the first transparent resin so as to cover the microlens and then hardening the second transparent resin;

forming a transparent second electrode on the second transparent resin;

forming the organic luminescent layer on the second electrode; and forming a first electrode on the organic luminescent layer;

wherein the light-emitting state of the organic luminescent layer is controlled by a switching element that is controlled by the first electrode and the transparent second electrode intersecting in a matrix form, the organic luminescent layer being provided between the first electrode and the second electrode.

2. The method of manufacturing an organic electroluminescent display device according to claim 1, wherein, when accumulating and hardening, the hardening is carried out while pressing a flat substrate against the second transparent resin which has been accumulated.

3. The method of manufacturing an organic electroluminescent display device according to claim 1, wherein, when forming the microlens, a film is formed of the second transparent resin on the substrate by spin coating.

4. The method of manufacturing an organic electroluminescent display device according to claim 1, wherein, when forming the microlens, the first transparent resin is formed so as to have a convex curved surface facing the second electrode.

* * * * *